United States Patent
Hager et al.

(10) Patent No.: US 9,410,265 B2
(45) Date of Patent: Aug. 9, 2016

(54) METHOD FOR PRODUCING A SEMICONDUCTOR WAFER COMPOSED OF SILICON WITH AN EPITAXIALLY DEPOSITED LAYER

(75) Inventors: Christian Hager, Kastl (DE); Thomas Loch, Burghausen (DE); Norbert Werner, Tengling (DE)

(73) Assignee: SILTRONIC AG, Munich (DE)

( * ) Notice: Subject to any disclaimer, the term of this patent is extended or adjusted under 35 U.S.C. 154(b) by 1101 days.

(21) Appl. No.: 13/014,796

(22) Filed: Jan. 27, 2011

(65) Prior Publication Data
US 2011/0189842 A1    Aug. 4, 2011

(30) Foreign Application Priority Data
Feb. 3, 2010   (DE) .................... 10 2010 006 725 U

(51) Int. Cl.
*C30B 25/12*   (2006.01)
*C30B 25/02*   (2006.01)

(52) U.S. Cl.
CPC ............... *C30B 25/02* (2013.01); *C30B 25/12* (2013.01)

(58) Field of Classification Search
CPC ........ C30B 25/00; C30B 25/02; C30B 25/04; C30B 25/12; C23C 16/00; C23C 16/01; C23C 16/04; C23C 16/042; C23C 16/44; C23C 16/4401; C23C 16/4404; C23C 16/4405
USPC .................. 117/84, 88–90, 93–97, 102, 106, 117/935–936
See application file for complete search history.

(56) References Cited

U.S. PATENT DOCUMENTS

| 5,993,770 | A | * | 11/1999 | Kuroyanagi | C01B 31/36 117/95 |
| 7,064,073 | B1 | | 6/2006 | U'ren | |
| 7,659,207 | B2 | | 2/2010 | Schauer et al. | |
| 2004/0067370 | A1 | | 4/2004 | Ebata et al. | |
| 2005/0160971 | A1 | * | 7/2005 | Otsuka | C23C 16/4405 117/89 |
| 2005/0250139 | A1 | | 11/2005 | Yamamoto et al. | |
| 2007/0065671 | A1 | * | 3/2007 | Li | H01L 21/2205 428/446 |
| 2007/0077737 | A1 | * | 4/2007 | Kobayashi | C23C 16/26 438/513 |
| 2008/0132042 | A1 | | 6/2008 | Li et al. | |
| 2008/0308036 | A1 | * | 12/2008 | Ito | C23C 16/45504 117/88 |
| 2009/0139448 | A1 | * | 6/2009 | Hirata | C23C 16/4584 117/107 |

FOREIGN PATENT DOCUMENTS

| DE | 10 2005 045 337 A1 | 4/2007 |
| EP | 1 533 836 A1 | 5/2005 |
| JP | 04-188720 A | 7/1992 |

(Continued)

*Primary Examiner* — Kenneth A Bratland, Jr.
(74) *Attorney, Agent, or Firm* — Brooks Kushman P.C.

(57) ABSTRACT

Semiconductor wafers composed of silicon with an epitaxially deposited layer, are prepared by:
- placing a dummy wafer on a susceptor of an epitaxy reactor;
- conducting an etching gas through the epitaxy reactor in order to remove residues on surfaces in the epitaxy reactor through the action of the etching gas;
- conducting a first deposition gas through the epitaxy reactor in order to deposit silicon on surfaces in the epitaxy reactor;
- replacing the dummy wafer by a substrate wafer composed of silicon; and
- conducting a second deposition gas through the epitaxy reactor in order to deposit an epitaxial layer on the substrate wafer.

12 Claims, 3 Drawing Sheets

(56) References Cited

FOREIGN PATENT DOCUMENTS

| JP | 05283306 | A | 10/1993 |
| JP | 200487920 | A | 3/2004 |
| JP | 2004-193396 | A | 7/2004 |
| JP | 2007-088473 | A | 4/2007 |
| KR | 10-2006-0088562 | A | 8/2006 |
| TW | 522451 | | 3/2003 |

* cited by examiner

METHOD FOR PRODUCING A SEMICONDUCTOR WAFER COMPOSED OF SILICON WITH AN EPITAXIALLY DEPOSITED LAYER

CROSS-REFERENCE TO RELATED APPLICATION

This application claims priority to German Patent Application No. DE 10 2010 006 725.3 filed Feb. 3, 2010 which is herein incorporated by reference.

BACKGROUND OF THE INVENTION

1. Field of the Invention

The invention relates to a method for providing a semiconductor wafer composed of silicon with an epitaxially deposited layer in an epitaxy reactor, comprising the following steps:

placing a dummy wafer on a susceptor of an epitaxy reactor;

conducting an etching gas through the epitaxy reactor in order to remove residues on surfaces in the epitaxy reactor through the action of the etching gas;

conducting a first deposition gas through the epitaxy reactor in order to deposit silicon on surfaces in the epitaxy reactor;

replacing the dummy wafer with a substrate wafer composed of silicon on a susceptor of the epitaxy reactor; and conducting a second deposition gas for depositing an epitaxial layer on the substrate wafer.

2. Background Art

A method for epitaxial deposition onto a substrate wafer is described in EP 1 533 836 A1, for example, which disclosed that it is advantageous and often necessary to remove residues from surfaces in the epitaxy reactor which have been deposited on these surfaces in an uncontrolled manner during the deposition of silicon on a substrate wafer. Such a step, referred to hereinafter as a "chamber etch," is carried out more or less frequently depending on the degree of contamination and quality requirements. If the epitaxially deposited layer on the substrate wafer is 20 µm or thicker, or if there are particularly high quality requirements, it is expedient to carry out a chamber etch after the deposition of an epitaxial layer on one substrate wafer before a further substrate wafer is coated. In other cases, the chamber etch can also take place less frequently, for example after every $2^{nd}$ to $8^{th}$ coating of substrate wafers. EP 1 533 836 A1 also proposes coating the etched surfaces in the epitaxy reactor with a thin film of silicon by conducting a deposition gas through the epitaxy reactor. The thin film of silicon seals the surfaces and prevents contaminants that diffuse from the surfaces from passing into the growing epitaxial layer during a subsequent coating of a substrate wafer. The deposition of a thin film of silicon on surfaces of the epitaxy reactor after the chamber etch is referred to hereinafter as "chamber coating".

DE 10 2005 045 337 A1 indicates that a chamber etch has a disadvantageous effect on the flatness of a substrate wafer subsequently coated with an epitaxial layer. Thus, in particular, the local flatness of such a semiconductor wafer is impaired. Therefore, it is recommended that the susceptor be hydrophilized after the chamber etch by means of a hydrophilic wafer being placed onto the susceptor for a short time. This procedure has the disadvantage that a dedicated method step is required for hydrophilizing the susceptor.

The chamber etch also has a disadvantageous effect on the lifetime of the minority charge carriers of a substrate wafer subsequently coated with an epitaxial layer. The lifetime of the minority charge carriers of such a semiconductor wafer, determined by microwave photoconductivity decay ("µ-PCD"), is significantly shorter than if chamber etch and chamber coating are dispensed with prior to the coating of a substrate wafer.

The chamber etch additionally has a corrosive effect on the susceptor and in particular on lift pins which are embedded in the bottom of the susceptor and which serve for raising and lowering the wafers. Susceptor and lift pins therefore have to be replaced comparatively often owing to wear as a result of corrosion.

SUMMARY OF THE INVENTION

Therefore, an object of the invention was to alleviate disadvantages associated with the chamber etch, without having to dispense with associated advantages and without having to accept new disadvantages. These and other objects are achieved by means of a method for producing a semiconductor wafer composed of silicon with an epitaxially deposited layer, comprising placing a dummy wafer on a susceptor of an epitaxy reactor; conducting an etching gas through the epitaxy reactor in order to remove residues on surfaces in the epitaxy reactor through the action of the etching gas;

conducting a first deposition gas through the epitaxy reactor in order to deposit silicon on surfaces in the epitaxy reactor;

replacing the dummy wafer by a substrate wafer composed of silicon; and conducting a second deposition gas in order to deposit an epitaxial layer on the substrate wafer.

DETAILED DESCRIPTION OF THE PREFERRED EMBODIMENTS

Figure 1:
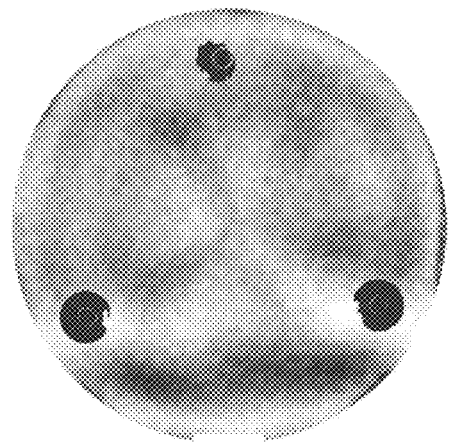
FIG. 1 illustrates pin halo on a substrate wafer prepared by the methods of the prior art.

Unlike the methods described in the prior art, the invention provides for a dummy wafer to lie on the susceptor both during the chamber etch and during the chamber coating. Various advantages are associated with this procedure. The lifetime of minority charge carriers of the first semiconductor wafer with an epitaxially deposited layer which is produced after chamber etch and chamber coating is longer than if the presence of the dummy wafer is dispensed with during the chamber etch and the chamber coating. Likewise, the wear in the case of susceptor and holding pins is lower. The dummy wafer shields a large part of the susceptor during the chamber etch and the chamber coating. Hydrogen chloride, which is usually contained in the etching gas during the chamber etch, is scarcely able, or is not able at all, to reach the shielded part of the susceptor, in particular the lift pins incorporated there. That part of the susceptor which is shielded by the dummy wafer is therefore protected from the corrosive influence of the etching gas during the chamber etch. During the subsequent chamber coating, the dummy wafer still lies on the susceptor, with the result that a thin film of silicon is also not deposited on that part of the susceptor which is shielded by the dummy wafer. This has an advantageous effect in various respects because the following disadvantages are avoided.

If the dummy wafer is dispensed with during the chamber etch and the chamber coating, the susceptor, after the chamber coating, is covered with a thin film of silicon that is contaminated with hydrogen chloride. During the coating of the front side of the substrate wafer with an epitaxial layer, hydrogen chloride diffuses from the film into the deposited epitaxial layer and causes the observed shortened lifetime of minority charge carriers.

If the dummy wafer is dispensed with during the chamber etch and the chamber coating, there is the risk, during the coating of the silicon substrate wafer with the epitaxial layer, that the substrate wafer, which in the region of its edge bears on a susceptor ledge, will grow together at points with the thin film of silicon that was deposited on the susceptor during the chamber coating. In this case, defects arise in the edge region of the rear side of the coated semiconductor wafer which bring about lattice stresses and are triggers of slip.

If the dummy wafer is dispensed with during the chamber etch and the chamber coating and use is made of a susceptor having a base composed of gas-impermeable material which has neither holes nor open pores, there is the risk, finally, that hydrogen will pass, during the coating of the substrate wafer, through a gap existing between the base of the susceptor and a lift pin to the rear side of the substrate wafer and a native oxide layer on the rear side of the substrate wafer will be locally resolved. This gives rise to transitions between native oxide layer and oxide-free regions which are visible as a so-called "pin halo" in concentrated light. These transitions impair the nanotopography of the rear side of the substrate wafer, that is to say that they cause height fluctuations of up to 60 nm, measured over a distance of 0.5 to 10 mm. The transitions do not arise if the dummy wafer is present during the chamber etch and the chamber coating. The dummy wafer shields the underlying part of the susceptor and thus maintains the hydrophilic character of the surface of the susceptor. This surface property subsequently protects the native oxide layer on the rear side of the substrate wafer from being resolved in the region of the lift pins.

The dummy wafer can consist, for example, of silicon, of silicon carbide, of graphite-coated silicon carbide, or of quartz. A dummy wafer composed of silicon carbide or a dummy wafer composed of silicon is preferred, and such a dummy wafer which is oxidized at least on the rear side or is covered there with a layer composed of deposited silicon dioxide is particularly preferred. The oxide layer protects, for example, underlying silicon of the dummy wafer against degradation by the etching gas and hydrophilizes that part of the susceptor which is covered by the dummy wafer. It is equally advantageous if the oxide layer covers the dummy wafer composed of silicon or silicon carbide not only on the rear side but completely. A dummy wafer composed of silicon or of silicon carbide which is coated with an LTO ("low thermal oxide") layer on the rear side or completely, that is to say on both sides and at the edges, is particularly preferred. The LTO layer is preferably 100 to 40,000 nm thick. It is also preferred to reuse the dummy wafer, that is to say to use it during at least one further chamber etch and during at least one further chamber coating which are carried out before the deposition of an epitaxial layer on another substrate wafer.

An epitaxy reactor having a capacity for coating an individual substrate wafer, for example an individual-wafer epitaxy reactor of the Centura type from Applied Materials, Inc. or of the Epsilon type from ASM International N.V., is preferably used for carrying out the method.

Dummy wafer and substrate wafer preferably bear on a ring composed of silicon carbide which bears on the susceptor, thereby reducing the thermal loading of the substrate wafer during the deposition of the epitaxial layer. As an equally preferred alternative, it is also possible to use a one-part susceptor with a susceptor ledge as edge support. In both cases, dummy wafer and substrate wafer have contact with the support only in the edge region.

The base of the susceptor preferably has a gas-permeable structure characterized by open pores or passage holes. However, it can also consist of a gas-impermeable material.

Prior to the chamber etch, the dummy wafer is placed on the susceptor. In this state, the rear side of the dummy wafer and the base of the susceptor lie opposite one another. The chamber etch is preferably carried out at a temperature of 1050 to 1200° C. A mixture of hydrogen chloride and hydrogen is preferably used as the etching gas. Hydrogen chloride is conducted through the epitaxy reactor at a gas flow rate of preferably 5 to 20 slm (standard liters per minute), and hydrogen at a gas flow rate of preferably 5 to 50 slm. The chamber etch preferably lasts 50 to 400 s.

The chamber coating is preferably carried out at a temperature of 1100 to 1200° C., preferably using a first deposition gas which contains trichlorosilane. The gas flow rate of the trichlorosilane is preferably 10 to 19 slm. The chamber coating preferably lasts 10 to 100 s. The dummy wafer used during the chamber etch lies on the susceptor during the chamber coating as well.

After the chamber coating, the temperature in the epitaxy reactor is lowered, preferably to a temperature of 550 to 900° C., and the dummy wafer is replaced by the substrate wafer. In this state, the rear side of the substrate wafer and the base of the susceptor lie opposite one another.

The substrate wafer is preferably a monocrystalline silicon wafer having a polished front side. The diameter of the substrate wafer is preferably 150 to 450 mm, for example 150 mm, 200 mm, 300 mm or 450 mm. The substrate wafer can be produced, for example, in accordance with the procedure described in DE 10 2005 045 337 A1.

Prior to the deposition of the epitaxial layer, the substrate wafer preferably undergoes the following pretreatment in the epitaxy reactor: firstly, the substrate wafer is subjected to a treatment with hydrogen ("$H_2$ bake") in order to remove the native oxide layer from the front side or from the rear side and the front side of the substrate wafer. Afterward, hydrogen chloride and hydrogen are conducted through the epitaxy reactor in order to smooth the surface of the front side of the substrate wafer prior to the deposition of the epitaxial layer.

After the pretreatment, the front side of the substrate wafer is coated with an epitaxial layer, preferably at a temperature of 1100° to 1200° C. by means of a second deposition gas being conducted through the epitaxy reactor. The rear side of the substrate wafer is preferably purged with hydrogen in the meantime. The second deposition gas contains compounds whose decomposition provides the substances that form the epitaxial layer. These substances preferably include silicon, germanium and dopants such as boron, phosphorus or arsenic. By way of example, a deposition gas containing trichlorosilane, hydrogen and diborane is preferred for the deposition of a silicon layer doped with boron. It is also possible to deposit layers which consist of materials other than silicon, for example composed of germanium or of silicon and germanium.

After the deposition of the epitaxial layer on the substrate wafer, the method comprising placing the dummy wafer on the susceptor and the chamber etch is carried out again or preferably 2 to 24 or more further substrate wafers are coated before the next chamber etch and chamber coating are carried out in the presence of the dummy wafer.

EXAMPLE

After a chamber etch and a chamber coating, substrate wafers composed of silicon having a diameter of 300 mm were coated with an epitaxial layer composed of silicon. The chamber etch in the presence of hydrogen chloride was carried out at a temperature of 1170° C. and lasted 200 s. The subsequent chamber coating was carried out at a temperature of 1150° C. and lasted 40 s. The first deposition gas used for this purpose consisted of a mixture of trichlorosilane and hydrogen, which were conducted through the epitaxy reactor at a gas flow rate of 17 slm and 30 slm, respectively.

The second deposition gas used for coating the front side of the substrate wafer consisted of a mixture of trichlorosilane and hydrogen. Trichlorosilane was conducted through the epitaxy reactor at a gas flow rate of 17 slm, and hydrogen at a gas flow rate of 50 slm. The coating duration was 100 s, and the coating temperature was 1150° C.

The coated semiconductor wafers were differentiated into those which were coated after a chamber etch and a chamber coating in the presence of a dummy wafer (semiconductor wafer in accordance with the invention), and those which were coated after a chamber etch and chamber coating in the absence of the dummy wafer (semiconductor wafer in accordance with comparative example). During the chamber etch and the chamber coating in the presence of a dummy wafer, use was made of a dummy wafer composed of silicon carbide which was coated with an LTO layer on the rear side.

A subsequent examination of the coated semiconductor wafers found the following result:

The lifetime of minority charge carriers, measured by means of μ-PCD, was on average shorter by 23% in the case of the semiconductor wafers in accordance with the comparative example than in the case of the semiconductor wafers in accordance with the example.

The nanotopography of the rear side, measured according to the method defined in SEMI M43 and expressed in the form of the threshold value T, was, with for example T=18 nm in comparison with for example T=55 nm, significantly better in the case of the semiconductor wafers in accordance with the example than in the case of the semiconductor wafers in accordance with the comparative example. The measurements were carried out using an instrument of the Wafersight type from ADE. The threshold value T was calculated as 3 sigma PV value ("PV=peak-to-valley") from the distribution of all the PV values measured over the FQA ("fixed quality area"). The square measurement zones had an edge length of 10 mm.

Figure 2:
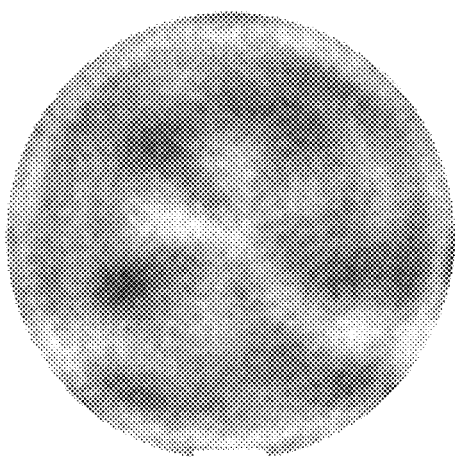
FIG. 2 illustrates the absence of pin halo on a wafer prepared in accordance with the inventive method.

FIG. 1 and FIG. 2 show the height fluctuations of the rear side of the coated semiconductor wafer that were determined during the nanotopography measurement. The improved nanotopography can be discerned from a comparison of these figures. Thus, in particular, the "pin halo" on the rear side of a semiconductor wafer in accordance with the comparative example, as is clearly visible in FIG. 1, is not present on the rear side of a semiconductor wafer in accordance with the example (FIG. 2).

Figure 3:
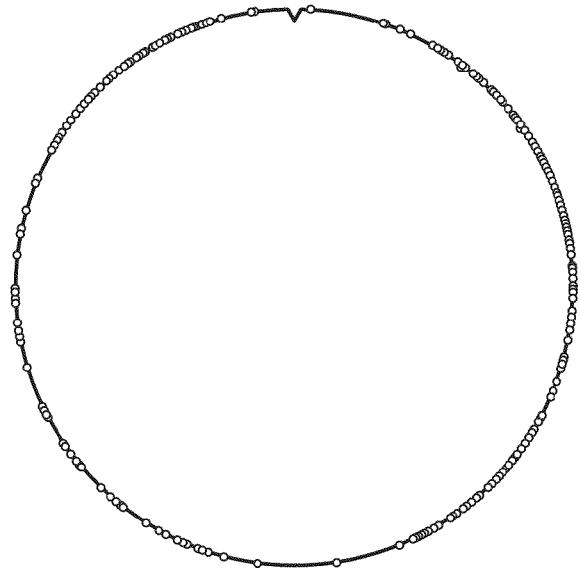
FIG. 3 illustrates slip-causing defects generated by the methods of the prior art.
Figure 4:
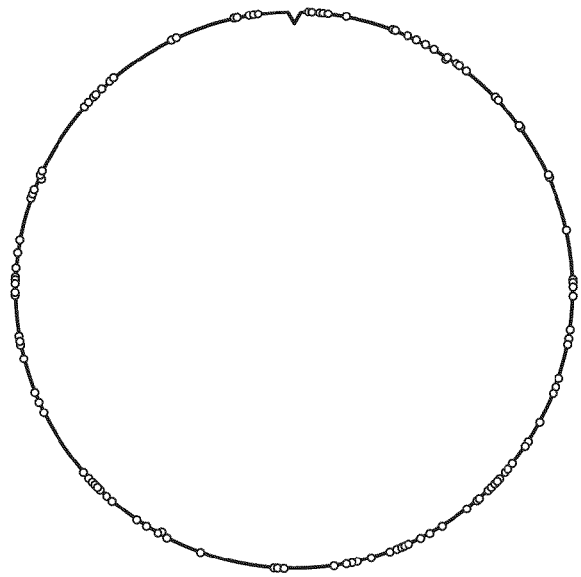
FIG. 4 illustrates slip-causing defects in wafers processed by the inventive method.

Defects in the edge region of the rear side were detected using an instrument of the NSX® type from Rudolph. Corresponding defect images (FIG. 3 and FIG. 4) show that the number and density of defects causing "slip" were significantly higher in the case of a semiconductor wafer in accordance with the comparative example (FIG. 3) than in the case of a semiconductor wafer in accordance with the example (FIG. 4).

Figure 5:
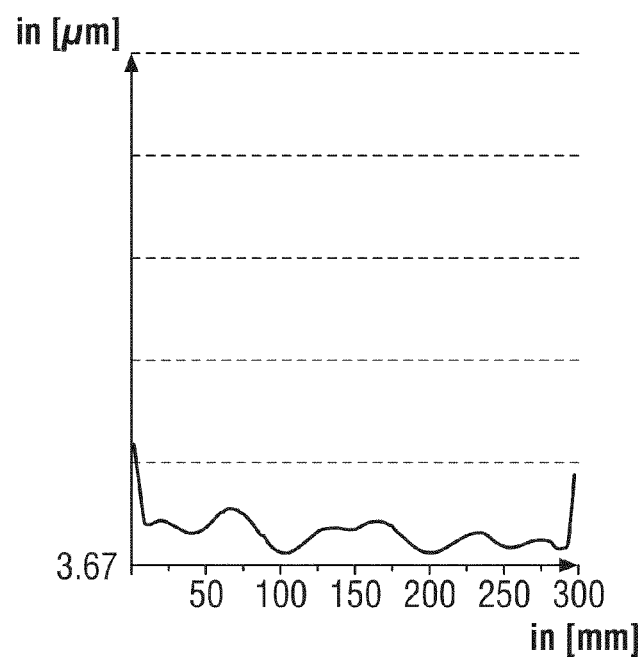
FIGS. 5 and 6 illustrate differences in wafer thickness after epitaxy by prior art methods (FIG. 5) and after epitaxy by the claimed method (FIG. 6).
Figure 6:
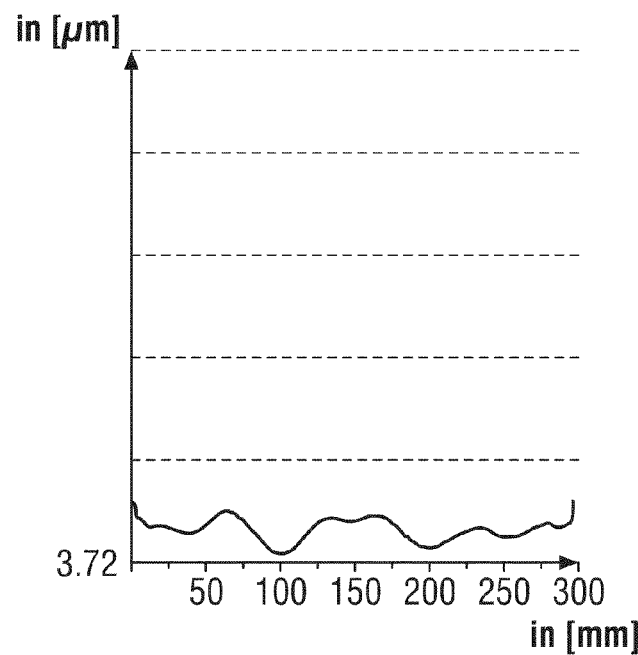

A comparison of FIG. 5 and FIG. 6 makes clear a further advantage of the method according to the invention. The difference in the thickness of an epitaxially deposited layer along the diameter of a coated semiconductor wafer is illustrated in each case. The semiconductor wafer in accordance with the comparative example (FIG. 5) has a pronounced increase in thickness at the edge. In the case of the semiconductor wafer in accordance with the example (FIG. 6), the increase in thickness at the edge is significantly smaller.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a silicon semiconductor wafer with an epitaxially deposited layer, comprising
   placing a dummy wafer on a susceptor of an epitaxy reactor, wherein the dummy wafer consists of silicon or comprises silicon or silicon carbide, and is covered with an oxide layer on at least the rear side;
   conducting an etching gas containing hydrogen chloride through the epitaxy reactor in order to remove residues on surfaces in the epitaxy reactor through the action of the etching gas;
   conducting a first deposition gas through the epitaxy reactor to deposit silicon on surfaces in the epitaxy reactor;
   replacing the dummy wafer by a silicon substrate wafer; and
   conducting a second deposition gas through the epitaxy reactor to deposit an epitaxial layer on the substrate wafer.

2. The method of claim 1, comprising
   depositing an epitaxial layer on at least 2 to 24 further substrate wafers, without the dummy wafer being placed on the susceptor in the interim.

3. The method of claim 1, wherein the oxide layer is an LTO layer.

4. The method of claim 1, wherein the dummy wafer is reused.

5. The method of claim 4, wherein the LTO layer has a thickness of from 100 nm to 40,000 nm.

6. The method of claim 1, wherein the dummy wafer and the silicon substrate are each supported only at the edges of the wafer.

7. The method of claim 6, wherein the edges of the wafers bear on a ring comprising silicon carbide which bears upon the susceptor.

8. The method of claim 6, wherein the edges of the wafer bear on a ledge in a one-part susceptor.

9. The method of claim 1, wherein the susceptor has a gas permeable structure.

10. The method of claim 1, wherein the reactor is at a temperature in the range of 1050° C. to 1200° C. during contact with the etching gas.

11. The method of claim 1, wherein the dummy wafer comprises silicon carbide.

12. The method of claim 1, wherein the dummy wafer comprises silicon carbide and the oxide layer is an LTO layer.

* * * * *